United States Patent
Faig et al.

(10) Patent No.: US 10,756,682 B1
(45) Date of Patent: Aug. 25, 2020

(54) COMPENSATING FOR TRANSMITTER NONLINEARITIES

(71) Applicant: Mellanox Technologies, Ltd., Yokneam (IL)

(72) Inventors: Hananel Faig, Jerusalem (IL); Shai Cohen, Haifa (IL); Liron Gantz, Haifa (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 16/779,610

(22) Filed: Feb. 2, 2020

Related U.S. Application Data (60) Provisional application No. 62/800,579, filed on Feb. 4, 2019.

(51) Int. Cl.
*H04L 25/49* (2006.01)
*H03F 1/32* (2006.01)

(52) U.S. Cl.
CPC .......... *H03F 1/3247* (2013.01); *H03F 1/3258* (2013.01); *H03F 1/3276* (2013.01); *H03F 2201/3224* (2013.01); *H03F 2201/3233* (2013.01)

(58) Field of Classification Search
CPC .... H03F 1/3247; H03F 1/3276; H03F 1/3258; H03F 2201/3224; H03F 2201/3233
USPC ........................................................ 375/296
See application file for complete search history.

(56) References Cited

U.S. PATENT DOCUMENTS

| 8,767,857 | B2* | 7/2014 | Bassam | H04B 7/0417 |
| | | | | 375/267 |
| 9,935,810 | B1* | 4/2018 | Hammler | H04L 25/03343 |
| 10,263,728 | B1* | 4/2019 | Jeraj | H04K 3/41 |
| 10,298,366 | B2* | 5/2019 | Hu | H03F 1/3247 |
| 2014/0348018 | A1* | 11/2014 | Bharadia | H04L 5/1423 |
| | | | | 370/252 |

OTHER PUBLICATIONS

Sadot et al., "Digital pre-compensation techniques enabling cost effective high-order modulation formats transmission", Journal of Lightwave Technology, vol. 37, No. 2, pp. 441-450, Jan. 15, 2019.
(Continued)

*Primary Examiner* — Don N Vo
(74) *Attorney, Agent, or Firm* — Kligler & Associates Patent Attorneys Ltd (57) ABSTRACT

A method for communication includes producing an error signal by comparing a driving signal applied to a transmitter to an output signal generated by the transmitter in response to the driving signal. The error signal is decomposed into a linear component having a first memory depth and a nonlinear component having one or more polynomial orders and a second memory depth that is less than the first memory depth. First coefficients, up to the first memory depth, of a linear predistortion kernel are computed for application to the driving signal so as to compensate for the linear component of the error signal. Second coefficients for the one or more polynomial orders, up to the second memory depth, of a nonlinear predistortion kernel are computed so as to compensate for the nonlinear component of the error signal. Operation of the transmitter is optimized using the first and second coefficients.

29 Claims, 4 Drawing Sheets

(56) References Cited

OTHER PUBLICATIONS

Mkadem et al., "Multi-band complexity-reduced generalized-memory-polynomial power-amplifier digital predistortion", IEEE Transactions on Microwave Theory and Techniques, vol. 64, No. 6, pp. 1763-1774, Jun. 2016.

Faig et al., "Dimensions-reduced Volterra digital pre-distortion based on orthogonal basis for band-limited nonlinear opto-electronic components", IEEE Photonics Journal, vol. 11, No. 1, pp. 1-14, Feb. 2019.

Stojanovic et al., "Volterra and Wiener equalizers for short-reach 100G PAM-4 Applications", Journal of Lightwave Technology, vol. 35, No. 21, pp. 4583-4594, Nov. 1, 2017.

Wang et al., "Optimal sizing of generalized memory polynomial model structure based on hill-climbing heuristic", Proceedings of the 46th European Microwave Conference, pp. 190-193, Oct. 4-6, 2016.

Yang et al., "Evaluation of effects of MZM nonlinearity on QAM and OFDM signals in RoF transmitter", International Topical Meeting on Microwave Photonics jointly held with the 2008 Asia-Pacific Microwave Photonics Conference, pp. 90-93, Sep.-Oct. 2008.

Faig et al., "Nonlinear System Identification Scheme for Efficient Compensators Design", Journal of Lightwave Technology, pp. 1-6, Dec. 31, 2019.

\* cited by examiner

COMPENSATING FOR TRANSMITTER NONLINEARITIES

CROSS-REFERENCE TO RELATED APPLICATION

This application claims the benefit of U.S. Provisional Patent Application 62/800,579, filed Feb. 4, 2019, which is incorporated herein by reference.

FIELD OF THE INVENTION

The present invention relates generally to communication systems, and particularly to methods and devices for mitigating distortion in such systems.

BACKGROUND

Demands for ever-greater communication data rates in data center networks have led to increasing use of optical interconnects, and even so have pushed transmission components to their physical limits. These optical interconnects use low-cost, power-efficient optoelectronic components, such as vertical-cavity surface-emitting lasers (VCSELs) and integrated Mach-Zender modulators (MZMs). In order to overcome bandwidth limitations, many links use high-order modulation formats, which in turn require large amplitude swings in the output signals from the transmitter. As a consequence, the transmission components are forced to operate outside their linear regimes. The resulting nonlinear distortion leads to a significant reduction in overall signal/noise ratio (SNR).

Methods for estimating and compensating for nonlinear distortion are known in the art, but they are difficult to implement in practice. Whereas the length of a linear filter tends to grow linearly with the severity of the inter-symbol interference (ISI) for which it is required to compensate, nonlinear filters grow at polynomial rates or even faster, as both the number of non-linear orders and the length of each order increase. (The "length" of a filter, as used in the present description and in the claims, refers to the number on taps in a discrete time-domain implementation of the filter, i.e., the number of input samples that are concurrently multiplied by respective tap coefficients and added to produce each filtered output sample. The filter length is also referred to as the memory depth or memory order.) Therefore, it is often difficult for the designer to satisfy the conflicting demands of both reducing nonlinear distortion and minimizing circuit size, cost and power consumption.

SUMMARY

Embodiments of the present invention that are described hereinbelow provide improved methods for mitigating distortion, as well as devices and systems implementing such methods.

There is therefore provided, in accordance with an embodiment of the invention, a method for communication, which includes producing an error signal by comparing a driving signal applied to a transmitter to an output signal generated by the transmitter in response to the driving signal. The error signal is decomposed into a linear component having a first memory depth and a nonlinear component having one or more polynomial orders and a second memory depth that is less than the first memory depth. First coefficients, up to the first memory depth, of a linear predistortion kernel are computed for application to the driving signal so as to compensate for the linear component of the error signal. Second coefficients for the one or more polynomial orders, up to the second memory depth, of a nonlinear predistortion kernel are computed for application to the driving signal so as to compensate for the nonlinear component of the error signal. Operation of the transmitter is optimized using the first and second coefficients.

In a disclosed embodiment, decomposing the error signal includes computing a Volterra series representation of the error signal, whereby the linear and nonlinear components of the error signal are represented respectively by linear and nonlinear parts of the Volterra series.

In some embodiments, the one or more polynomial orders include a plurality of polynomial orders, and computing the second coefficients includes constraining the second memory depth to a given number over all of the polynomial orders, so that the nonlinear predistortion kernel includes the same given number of the second coefficients for all of the polynomial orders. In one embodiment, computing the first coefficients includes finding an optimal number of the first coefficients in order to compensate for the linear component of the error signal, and constraining the second memory depth includes constraining the given number of the second coefficients to be less than the optimal number of the first coefficients. Additionally or alternatively, computing the second coefficients includes finding an optimal number of the second coefficients over all of the polynomial orders in order to compensate for the nonlinear component of the error signal.

In some embodiments, optimizing the operation of the transmitter includes applying a digital predistortion, using the first and second coefficients, to a sequence of samples of the driving signal that are input to the transmitter. In one embodiment, applying the digital predistortion includes applying a look-up table (LUT) based on the second coefficients and a finite impulse response (FIR) filter including the first coefficients to the sequence of the samples in order to generate predistorted samples for input to the transmitter. In a disclosed embodiment, applying the LUT includes looking up the samples in the sequence in the LUT in order to generate linearized samples, and applying the FIR includes multiplying the linearized samples by the first coefficients to generate respective tap products, and summing the tap products to generate the predistorted samples. Additionally or alternatively, optimizing the operation of the transmitter includes identifying optimal values of the first and second memory depths and setting respective numbers of the first and second coefficients to be used in the digital predistortion according to the optimal values of the first and second memory depths.

In alternatively embodiments, optimizing the operation of the transmitter includes estimating a dependence of the second coefficients on an operating parameter of the transmitter, and setting the operating parameter responsively to the estimated dependence. In one embodiment, setting the operating parameter includes adjusting a bias voltage applied to the transmitter. Additionally or alternatively, setting the operating parameter includes adjusting a modulation range of the transmitter. Further additionally or alternatively, optimizing the operation of the transmitter includes analyzing a compatibility of the transmitter with a physical link over which the output signal is to be transmitted, and modifying a property of the physical link in order to rectify a detected incompatibility.

In a disclosed embodiment, the transmitter includes an optoelectronic component to which the driving signal is applied.

There is also provided, in accordance with an embodiment of the invention, a system for communication analysis, including a memory configured to record an error signal produced by comparing a driving signal applied to a transmitter to an output signal generated by the transmitter in response to the driving signal. A processor is configured to decompose the error signal into a linear component having a first memory depth and a nonlinear component having one or more polynomial orders and a second memory depth that is less than the first memory depth, to compute first coefficients, up to the first memory depth, of a linear predistortion kernel for application to the driving signal so as to compensate for the linear component of the error signal, to compute second coefficients for the one or more polynomial orders, up to the second memory depth, of a nonlinear predistortion kernel for application to the driving signal so as to compensate for the nonlinear component of the error signal, and to optimize operation of the transmitter using the first and second coefficients.

There is additionally provided, in accordance with an embodiment of the invention, a computer software product, including a non-transitory computer-readable medium in which program instructions are stored, which instructions, when read by a processor, cause the processor to receive an error signal produced by comparing a driving signal applied to a transmitter to an output signal generated by the transmitter in response to the driving signal, to decompose the error signal into a linear component having a first memory depth and a nonlinear component having one or more polynomial orders and a second memory depth that is less than the first memory depth, to compute first coefficients, up to the first memory depth, of a linear predistortion kernel for application to the driving signal so as to compensate for the linear component of the error signal, to compute second coefficients for the one or more polynomial orders, up to the second memory depth, of a nonlinear predistortion kernel for application to the driving signal so as to compensate for the nonlinear component of the error signal, and to optimize operation of the transmitter using the first and second coefficients.

The present invention will be more fully understood from the following detailed description of the embodiments thereof, taken together with the drawings in which:

DETAILED DESCRIPTION OF EMBODIMENTS

Overview

Embodiments of the present invention that are described herein address the problem of characterizing the nonlinear distortion in a communication system, in a way that enables efficient compensation for nonlinear effects in optimizing the operation of the system. (Although the description that follows focuses on nonlinear distortion introduced by a transmitter in such a system, the principles of the present invention may alternatively be applied in dealing with other nonlinearities.) This optimization may take the form, for example, of selecting the number of nonlinear orders to handle in designing an equalization filter, as well as selecting the memory depth (i.e., the number of taps or coefficients) of the filter that should be applied to each order. Additionally or alternatively, such optimization may be applied in setting coefficient values and other operating parameters in order to improve the performance of an existing circuit.

A variety of methods are known in the art for creating mathematical models of nonlinear effects. Some methods of this sort use Volterra series, which is an expansion of a Taylor series to include temporal effects. Discrete-time, real-valued Volterra series have the following general form, which assumes a uniform memory depth for all the nonlinear orders:

$$x(n) = h_0 + \sum_{k=1}^{K} \sum_{t_1=0}^{M} \ldots \sum_{t_k=0}^{M} h_k(t_1 \ldots t_k) \prod_{j=1}^{k} y(n-t_j)$$

In this formula, $x(n)$ is the input to the transmitter, $y(n)$ is the output, K is the number of nonlinear orders in the model, and M is the memory depth, which is assumed to be constant for all orders. The set of coefficients of the Volterra series $\{h_k(t_1 \ldots t_k)\}$ is also referred to as the kernel, whose values characterize the nonlinear response of the transmitter (or other system components that are subjects of the model). Due to cross-terms in the series, the size of the kernel p grows rapidly with the number of nonlinear orders and the memory depth. Specifically, $$\rho = \sum_{k=0}^{K} \binom{k+M-1}{k} = \frac{(K+M)!}{K!M!}.$$

In working with bandwidth-limited systems, such as communication links, however, the inventors realized that the actual memory depth that is required in the higher orders (k>1) of the kernel decreases rapidly with increasing order. In other words, the number of coefficients M(k) that is required to represent each of the nonlinear components k of distortion in the transmitter decreases monotonically with increasing k:

$$M(k_i) > M(k_j) \forall k_i < k_j$$

Moreover, in many practical applications, transmitters can be represented accurately by a Volterra series that is constrained by the assumption that all of the higher polynomial orders have the same memory depth, and thus the same number of coefficients M(k>1), which is less than M(1). These constraints reduce the number of degrees of freedom sufficiently so that the computation of the optimal kernel {$h_k(t_1 \ldots t_k)$} becomes mathematically tractable, without substantially degrading the accuracy of the model. Alternatively, this sort of analysis may be applied with fewer constraints, though at the expense of higher computational complexity.

On this basis, the Volterra series can be decomposed into linear and nonlinear parts, and the corresponding linear and nonlinear components of the kernel can be defined and optimized separately. For example, using $M(1)=3$, $M(k>1)=1$ and $K=2$, the Volterra series becomes:

$$x(n) = h_0 + \underbrace{h_1 y(n) + h_2 y(n-1) + h_3 y(n-2) + h_4 y(n-3)}_{linear}$$

$$\underbrace{+ h_5 y(n)^2 + h_6 y(n-1)^2 + h_7 y(n) y(n-1)}_{nonlinear}$$

Using this analysis, some embodiments of the present invention define and apply two different compensators: a simple linear compensator with longer memory, and a nonlinear compensator with shorter memory. Although the nonlinear compensator in the above example includes only a single nonlinear order ($k=2$), higher orders can be incorporated in the nonlinear compensator in similar fashion.

Distortion compensation can be applied either by an equalizer on the receive side of the communication line or by predistortion on the transmit side. Although receive-side equalization may be preferable when distortion is linear, the inventors have found that the most efficient and effective way to compensate for nonlinear distortion originating in the transmitter is by adding digital predistortion (DPD) to the input signal that is used to drive the transmitter. In this case, the method of analysis described above is reversed in order to find the coefficients of a predistortion kernel for application to the input driving signal $x(n)$, to give a predistorted digital signal $\hat{x}(n)$ for input to the transmitter. The predistortion kernel is optimized, as described below, so as to minimize the error between the original input $x(n)$ and the transmitter output signal $y(n)$.

Embodiments of the present invention use these principles of analysis and predistortion in optimizing the operation of a transmitter. For this purpose, an error signal is produced (either by actual measurement or simulation) by comparing a driving signal $x(n)$ that is applied to the transmitter to an output signal $y(n)$ that is generated by the transmitter in response to the driving signal. A processor decomposes the error signal into a linear component having a given memory depth and a nonlinear component having one or more polynomial orders and a memory depth that is smaller than that of the linear component. The processor computes coefficients, up to the given memory depth, of a linear predistortion kernel for application to the driving signal. The processor also computes coefficients for the one or more polynomial orders, up to the smaller memory depth, of a nonlinear predistortion kernel.

Application of the linear and nonlinear predistortion kernels to the driving signal compensates respectively for the linear and nonlinear component of the error signal. The characteristics of these kernels, in terms of their memory depths, number of significant nonlinear orders, and coefficient values, are used, as noted earlier, in optimizing the operation of the transmitter, for example in selecting filter characteristics the design phase of the transmitter or in setting operating parameters of an existing transmitter of system.

System Description

Figure 1:
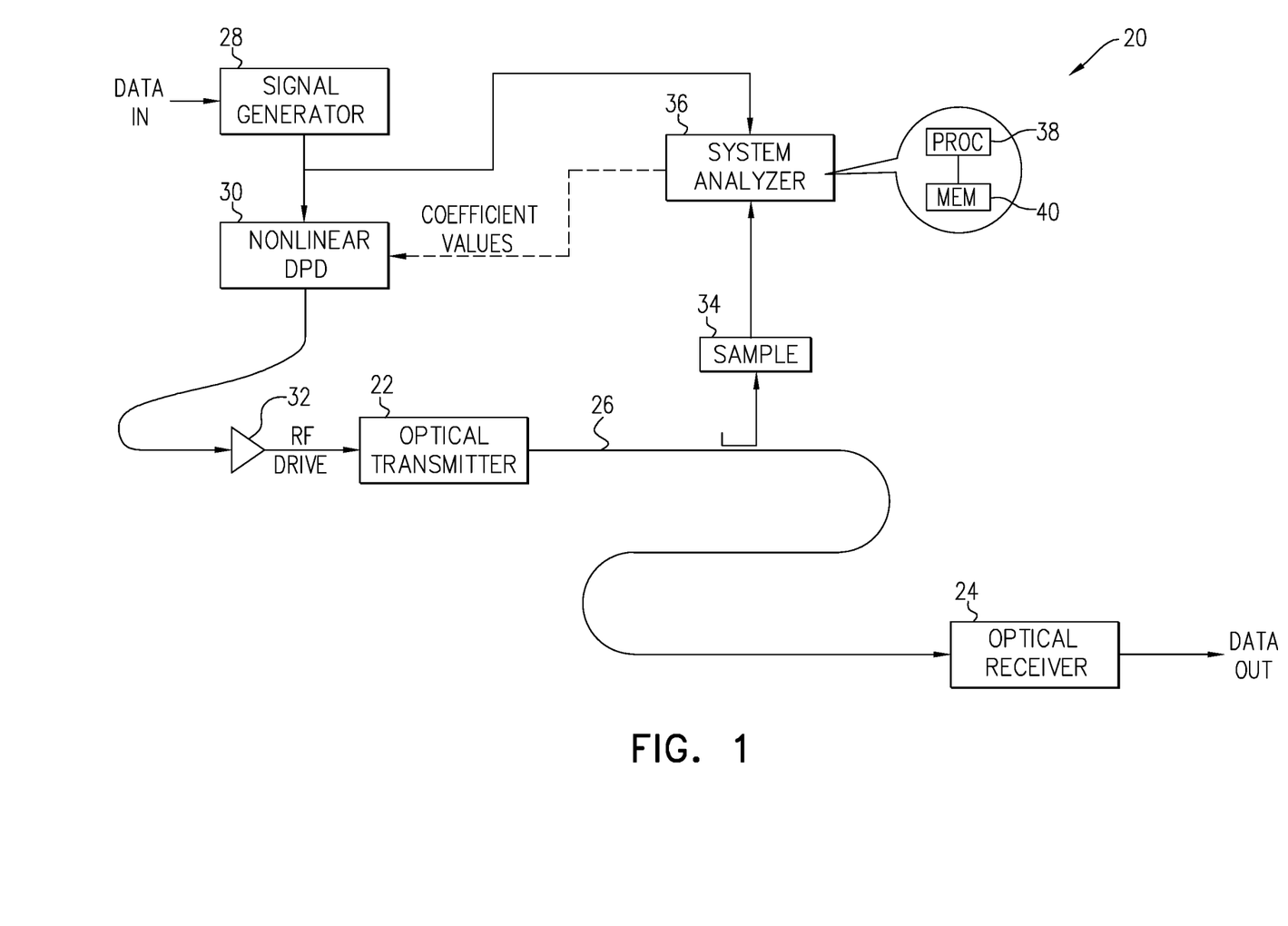
FIG. 1 is a block diagram that schematically illustrates a communication system with digital predistortion (DPD), in accordance with an embodiment of the invention.

FIG. 1 is a block diagram that schematically illustrates a communication system 20 with digital predistortion (DPD), in accordance with an embodiment of the invention. This figure shows a typical operating environment in which principles of the present invention may be implemented. In the pictured example, an optical transmitter 22 transmits a digital signal to an optical receiver 24 over a communication link 26, such as a fiberoptic cable. Optical transmitter 22 is assumed to include an optoelectronic component, such as a VCSEL or MZM, whose modulation gives rise to nonlinear distortion at the transmitter output. Alternatively, the principles of the present invention may be applied to transmitters that operate over links of other sorts, such as RF cables and wireless links.

A signal generator 28 in system 20 receives digital data for transmission over link 26, digitally modulates the data to generate a corresponding sequence of symbols, and converts the sequence of symbols into a digital driving signal having the form of a stream of digital samples $x(n)$, as is known in the art. The digital samples are input to a nonlinear DPD block 30, which applies a digital predistortion to the samples, including both linear and nonlinear components, as explained above. The structure and operation of block 30 are described in greater detail hereinbelow. An analog drive circuit converts the predistorted sample stream into an analog driving signal, which it applies to drive transmitter 22.

A sensor 34, comprising a suitable photodiode, for example, samples the optical signals that that are output from transmitter 22 and generates a corresponding stream of output samples $y(n)$. A system analyzer 36 produces an error signal by comparing the samples $x(n)$ of the driving signal that is applied to transmitter 22 to the samples $y(n)$ of the output signal. As explained above, system analyzer 36 decomposes the error signal into linear and nonlinear components, and based on these components, computes the coefficient values of the linear and nonlinear predistortion kernels for application by nonlinear DPD block 30 to the samples $x(n)$. System analyzer 36 typically performs this kernel computation as a preliminary step, before transmitter 22 begins actual data transmission, in order to set the coefficient values in DPD block 30 and/or set other operating parameters of transmitter 22. Additionally or alternatively, system analyzer 36 may continue to evaluate and update the coefficient values during operation of system 20 in order to compensate for changes in the distortion characteristics of the transmitter over time.

In the pictured example, system analyzer 36 comprises a general-purpose computer processor 38, along with a memory 40, which records the samples and the error signal that are used by the processor in its kernel computation. Processor 38 performs the functions that are described herein under the control of software, which may be downloaded to the system analyzer in electronic form, over a network, for example. Additionally or alternatively, the software may be stored in tangible, non-transitory computer-readable media, such as optical, magnetic, or electronic memory media. Further additionally or alternatively, at least some of the functions of processor 38 may be performed by a digital signal processor or by digital logic circuits, which may be hard-wired or programmable.

Figure 2:
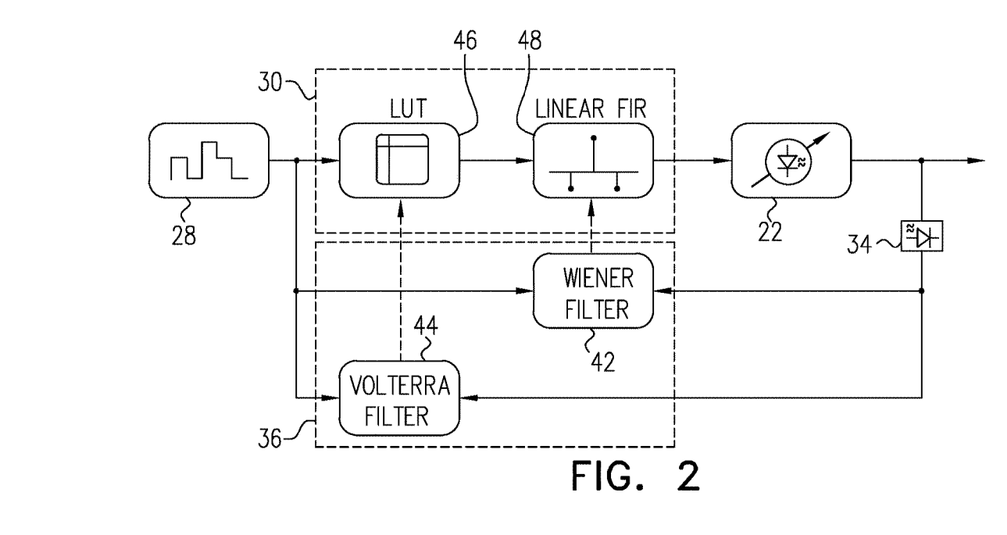
FIG. 2 is a block diagram that schematically illustrates components involved in adjustment of a transmitter with DPD, in accordance with an embodiment of the invention.

FIG. 2 is a block diagram that schematically shows details of the structure and adjustments of nonlinear DPD block 30, in accordance with an embodiment of the invention. In this embodiment, DPD block 30 comprises a look-up table (LUT) 46 with entries based on the nonlinear kernel coefficients, and a finite impulse response (FIR) filter 48 with taps based on the linear kernel coefficients. In other words, DPD block 30 first looks up each successive sample or sub-sequence of samples (with the number of samples depending on the memory depth M(k>1)) in LUT 46 to read out linearized sample values. The DPD block then inputs these linearized samples to FIR 48, in which the linearized samples are multiplied by the linear kernel coefficients to generate respective tap products, which are summed to generate the predistorted samples for application to transmitter 22.

The elements of DPD block 30 in this embodiments, including filter 48, are typically implemented in digital hardware logic, which may be hard-wired or programmable, along with a suitable memory to hold LUT 46. Alternatively, at least some of the functions of DPD block may be implemented in a programmable DSP or in software or firmware running on a microcontroller or other processor.

At the design stage of DPD block 30, the value of the memory depth M(1) of the linear part of the DPD can be optimized, in the sense that the number of taps in FIR filter 48 is chosen so as to be sufficient to achieve a certain level of SNR, without exceeding the number of taps necessary for this purpose. The value of the memory depth M(k>1) for the nonlinear part of the DPD is likewise optimized. Because the optimal value of M(k>1) is generally small (for example, equal to 2 or 3), the number of entries in LUT 46 is also manageable, with one table entry for each sub-sequence of M(k>1) input samples. Another advantage of this approach is that because all the nonlinear orders are constrained to have the same memory depth, the size of the LUT is not affected by the number of nonlinear orders that are included in the kernel.

Although FIG. 2 shows a particular serial implementation of DPD block 30, other implementations can be used in alternative embodiments of the present invention. For example, when the nonlinear component of the distortion is small, FIR 48 may precede LUT 46 in the processing order. As another example, the input samples may be applied to LUT 46 and FIR 48 in parallel, and the outputs may then be summed. Further alternatively, DPD block 30 may apply other filtering architectures that are known in the art, such as frequency-domain filtering.

As explained above, system analyzer 36 computes an error signal based on the difference between the respective samples output by signal generator 28 and by sensor 34, and decomposes the error signal into linear and nonlinear components. Processor 38 uses these error components in computing the linear and nonlinear parts of the predistortion kernel. For example, processor 38 may apply a Wiener filter 42 in computing the linear predistortion coefficients, while applying a polynomial Volterra filter 44, as defined above, in computing the nonlinear predistortion coefficients. The kernel computations may be carried out using any suitable method of optimization that is known in the art, typically using the mean squared error (MSE) as the cost function. For example, processor 38 may apply a single-step linear least squares estimation algorithm for this purpose, or an adaptive least mean squares algorithm. Alternatively, the kernel computations may use other cost functions, such as the bit error rate (BER), as well as other sorts of estimation algorithms that are known in the art, such as recursive least squares (RLS) estimation.

Processes of Optimization

Figure 3:
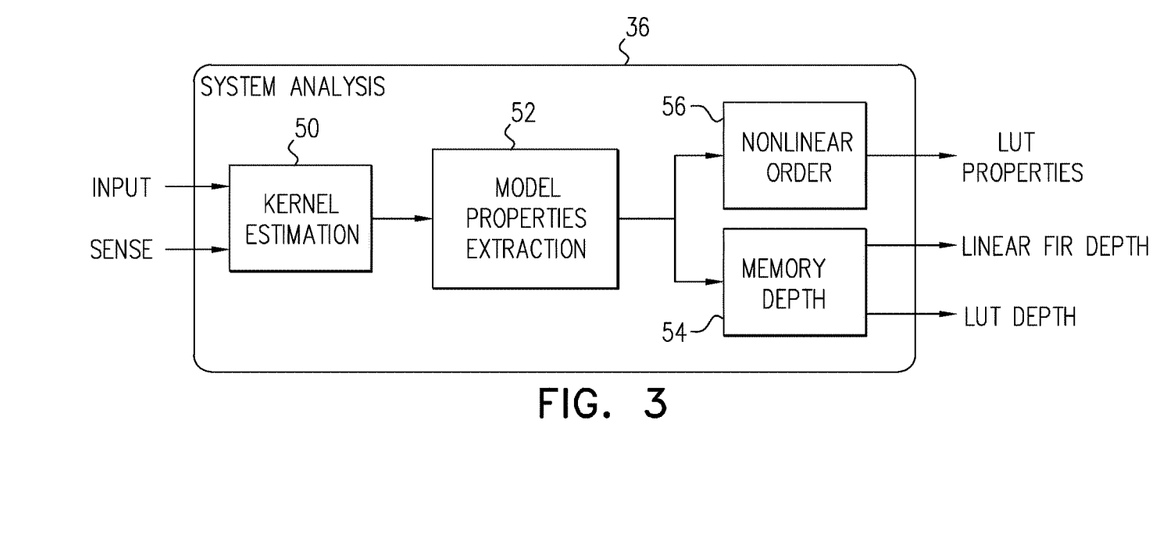
FIG. 3 is a flow chart that schematically illustrates a method for optimizing DPD coefficients, in accordance with an embodiment of the invention.

FIG. 3 is a flow chart that schematically illustrates a method for optimizing DPD coefficients, in accordance with an embodiment of the invention. For the sake of concreteness and clarity, it is assumed that this method is carried out by system analyzer 36 in system 20. The principles of this method may similarly be applied, mutatis mutandis, in correcting for nonlinearities in other systems, as well as in optimizing other operating parameters.

The method of FIG. 3 begins with a process of kernel estimation 50, in which processor 38 computes coefficients of the linear and nonlinear distortion kernels, as explained above. Processor 38 may repeat the computation under different system conditions and using different values of the Volterra series parameters M(1), M(k>1) and K, for the purpose of extracting model properties 52. This step enables the designer or system operator to observe and understand the nonlinearities in system 20 and how these nonlinearities are affected by the various parameters.

Model properties 52 also enable the designer or system operator to choose the parameter values that will best mitigate nonlinear effects. In the present example, the model properties indicate an optimal memory depth 54 for purposes of mitigating distortion in DPD block 30. Specifically, the model properties enable the designer or operator to find the optimal number of taps to include in FIR filter 48, as well as the optimal number of coefficients (and hence input samples) to use in generating LUT 46. The model properties can also be used to find an optimal nonlinear order 56 to use in computing the entries of LUT 46. As noted earlier, the numbers of taps, coefficients and orders are "optimal" in the sense that they are sufficient to achieve a certain level of SNR, without exceeding the number of taps necessary for this purpose, and thus represent the best tradeoff between the cost and performance of the target system.

Figure 4:
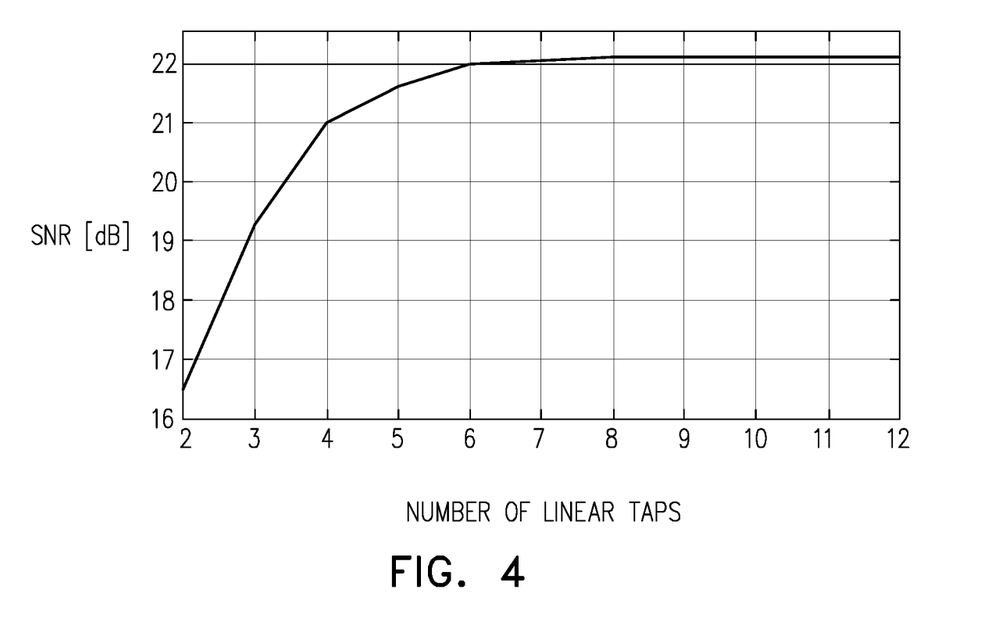
FIG. 4 is a schematic plot of SNR as a function of the number of taps in a linear component of a DPD circuit, in accordance with an embodiment of the invention.

FIG. 4 is a schematic plot of SNR as a function of the number of taps (coefficients) in linear FIR filter 48 in DPD block 30, in accordance with an embodiment of the invention. The SNR in this example represents the difference between the optimal non-distorted signal and the equalized received signal, and is formulated as:

$$SNR = 10 \cdot \log_{10}\left(\frac{E[(\text{optimal})^2]}{E[(\text{optimal}-\text{received})^2]}\right)$$

wherein E[•] is the expectation operator. The plot in FIG. 4 shows that the optimal number of taps is six, since the SNR increases significantly with each tap that added up to the sixth, but only negligibly with the seventh and subsequent taps. These circuit characteristics, however, are presented solely by way of example, to illustrate the optimization of a certain type of transmitter design; and other systems and components will typically exhibit different characteristics.

Figure 5:
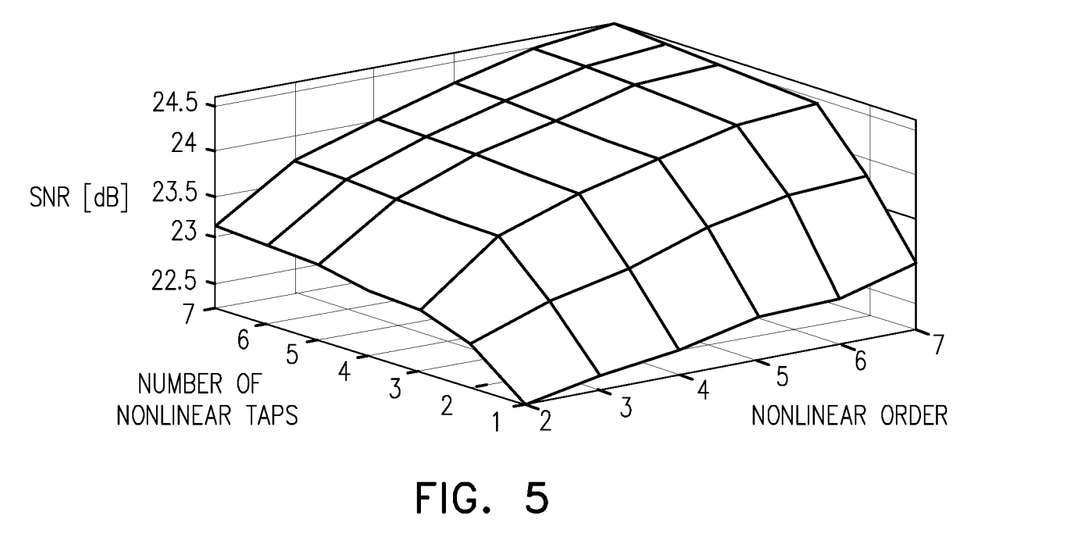
FIG. 5 is a schematic plot of SNR as a function of the numbers of taps and nonlinear orders in a nonlinear component of a DPD circuit, in accordance with an embodiment of the invention.

FIG. 5 is a schematic plot of SNR as a function of the numbers of taps and nonlinear orders used in generating LUT 46 in DPD block 30, in accordance with an embodiment of the invention. The starting point for this plot is the SNR level of about 22 dB that is achieved by application of FIR 48, as illustrated in FIG. 4. As in the case of FIG. 4, the characteristics in FIG. 5 are shown solely by way of example. The characteristics in this case were computed subject to the constraint that all orders share the number of taps (i.e., have the same memory depth). Alternatively, plots of this sort can be computed and used without this constraint, though at the cost of greater complexity.

In the example shown in FIG. 5, the optimal number of nonlinear taps is three, since SNR increases significantly up to the third tap but only negligibly thereafter. Incorporating seven nonlinear orders gives the greatest improvement in the SNR. Although this high order of nonlinearity complicates the computation of the entries in LUT 46, the computation can be performed offline and does not increase the actual size of the LUT.

Figure 6A:
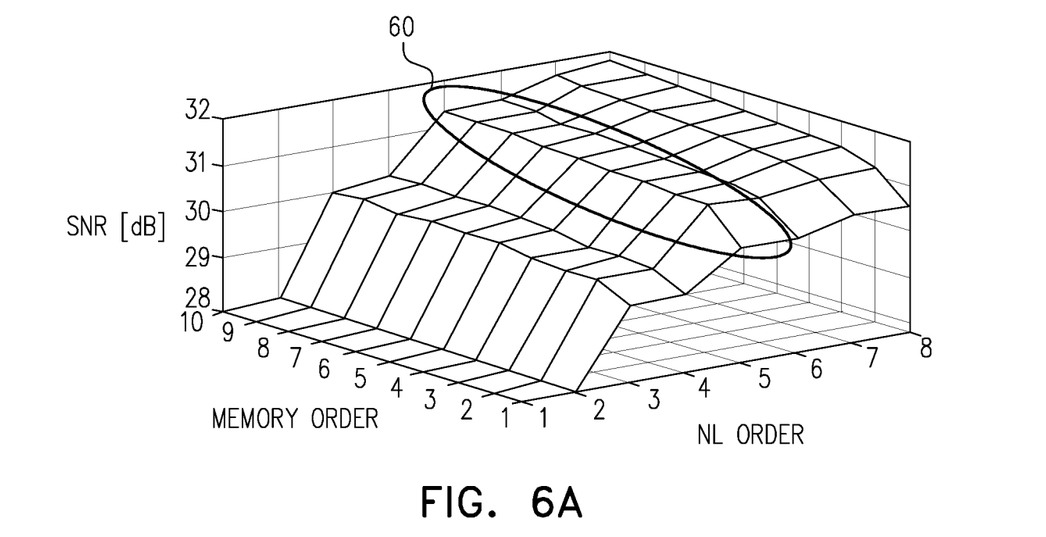
FIGS. 6A and 6B are schematic plots of SNR as a function of nonlinear order in an MZM, showing the effect of bias on nonlinear distortion, in accordance with an embodiment of the invention.
Figure 6B:
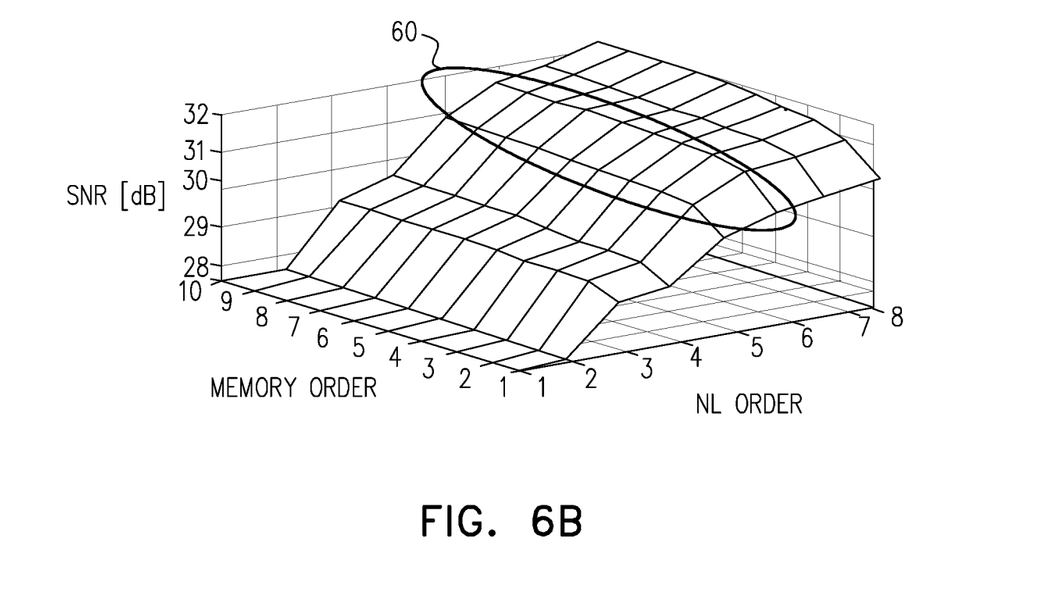

FIGS. 6A and 6B are schematic plots of SNR as a function of nonlinear order in an MZM, showing the effect of bias on nonlinear distortion, in accordance with an embodiment of the invention. The MZM comprises a Mach-Zender interferometer with two parallel legs, in an electro-optical medium that applies a variable phase shift to (at least) one of the legs as a function of the applied voltage. The MZM is inherently nonlinear, with a sinusoidal response to variations in the applied voltage level about the default bias ($V_{\pi/2}$). In the embodiment of FIGS. 6A/B, system analyzer 36 computes the nonlinear predistortion kernel of an MZM in order to analyze its voltage response and bias voltage.

Since the sine is an odd function, its Volterra series representation should include only odd polynomial orders. This situation is illustrated in FIG. 6A, in which the bias voltage of the MZM is set properly to $V_{\pi/2}$. Thus, as expected, only the odd polynomial orders (mainly the third and fifth orders) contribute to the distortion. On the other hand, in FIG. 6B, the bias voltage is offset from $V_{\pi/2}$, with the result that the contributions of the third and fifth orders are reduced, while the sixth polynomial order makes a significant contribution to the kernel. This effect can be seen in a region 60 of the two plots.

Thus, the nonlinear coefficients derived by system analyzer 36 provide an estimate of the dependence of the nonlinear coefficients on the operating parameters of the transmitter—specifically on the bias voltage in the present example. Based on this information, a system operator will adjust the bias voltage of the MZM in order to achieve the desirable characteristic shown in FIG. 6A.

By the same token, the system designer or operator may observe the effect of the range of modulation voltages on the nonlinear kernel coefficients computed by the system analyzer. As long as the distortion can be properly compensated by DPD block 30, the voltage range can be increased in order to increase the depth of modulation and thus support higher-order digital modulation schemes. The limit of the modulation range may be set at the point at which it is no longer possible to achieve the desired SNR due to excessive nonlinear distortion. More generally, the limit of the modulation range is chosen based on the optimal tradeoff between cost and performance, which can include additional factors besides the distortion.

The techniques of nonlinear analysis that are described above are not limited to these specific operating parameters and DPD coefficients. Other applications will be apparent to those skilled in the art after reading the above description and are considered to be within the scope of the present invention. For example, estimation of the nonlinear kernel coefficients may be used in defining physical link properties, including nonlinear reflections. The compatibility of a particular physical link with a given transmitter and receiver can be analyzed in this fashion, and the link properties can then be modified as necessary to rectify problems that are detected. As another example, estimation of the nonlinear kernel coefficients can be used to analyze and optimize the equalization that is required to compensate for instabilities (such as temperature-related drift) of an external optical modulator, such as a micro-ring modulator.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for communication, comprising:
producing an error signal by comparing a driving signal applied to a transmitter to an output signal generated by the transmitter in response to the driving signal;
decomposing the error signal into a linear component having a first memory depth and a nonlinear component having one or more polynomial orders and a second memory depth that is less than the first memory depth;
computing first coefficients, up to the first memory depth, of a linear predistortion kernel for application to the driving signal so as to compensate for the linear component of the error signal;
computing second coefficients for the one or more polynomial orders, up to the second memory depth, of a nonlinear predistortion kernel for application to the driving signal so as to compensate for the nonlinear component of the error signal; and
optimizing operation of the transmitter using the first and second coefficients.

2. The method according to claim 1, wherein decomposing the error signal comprises computing a Volterra series representation of the error signal, whereby the linear and nonlinear components of the error signal are represented respectively by linear and nonlinear parts of the Volterra series.

3. The method according to claim 1, wherein the one or more polynomial orders comprise a plurality of polynomial orders, and wherein computing the second coefficients comprises constraining the second memory depth to a given number over all of the polynomial orders, so that the nonlinear predistortion kernel comprises the same given number of the second coefficients for all of the polynomial orders.

4. The method according to claim 3, wherein computing the first coefficients comprises finding an optimal number of the first coefficients in order to compensate for the linear component of the error signal, and wherein constraining the second memory depth comprises constraining the given number of the second coefficients to be less than the optimal number of the first coefficients.

5. The method according to claim 3, wherein computing the second coefficients comprises finding an optimal number of the second coefficients over all of the polynomial orders in order to compensate for the nonlinear component of the error signal.

6. The method according to claim 1, wherein optimizing the operation of the transmitter comprises applying a digital predistortion, using the first and second coefficients, to a sequence of samples of the driving signal that are input to the transmitter.

7. The method according to claim 6, wherein applying the digital predistortion comprises applying a look-up table (LUT) based on the second coefficients and a finite impulse response (FIR) filter comprising the first coefficients to the sequence of the samples in order to generate predistorted samples for input to the transmitter.

8. The method according to claim 7, wherein applying the LUT comprises looking up the samples in the sequence in the LUT in order to generate linearized samples, and wherein applying the FIR comprises multiplying the linearized samples by the first coefficients to generate respective tap products, and summing the tap products to generate the predistorted samples.

9. The method according to claim 6, wherein optimizing the operation of the transmitter comprises identifying optimal values of the first and second memory depths and setting respective numbers of the first and second coefficients to be used in the digital predistortion according to the optimal values of the first and second memory depths.

10. The method according to claim 1, wherein optimizing the operation of the transmitter comprises estimating a dependence of the second coefficients on an operating parameter of the transmitter, and setting the operating parameter responsively to the estimated dependence.

11. The method according to claim 10, wherein setting the operating parameter comprises adjusting a bias voltage applied to the transmitter.

12. The method according to claim 10, wherein setting the operating parameter comprises adjusting a modulation range of the transmitter.

13. The method according to claim 1, wherein optimizing the operation of the transmitter comprises analyzing a compatibility of the transmitter with a physical link over which the output signal is to be transmitted, and modifying a property of the physical link in order to rectify a detected incompatibility.

14. The method according to claim 1, wherein the transmitter comprises an optoelectronic component to which the driving signal is applied.

15. A system for communication analysis, comprising:
a memory configured to record an error signal produced by comparing a driving signal applied to a transmitter to an output signal generated by the transmitter in response to the driving signal; and
a processor, which is configured to decompose the error signal into a linear component having a first memory depth and a nonlinear component having one or more polynomial orders and a second memory depth that is less than the first memory depth, to compute first coefficients, up to the first memory depth, of a linear predistortion kernel for application to the driving signal so as to compensate for the linear component of the error signal, to compute second coefficients for the one or more polynomial orders, up to the second memory depth, of a nonlinear predistortion kernel for application to the driving signal so as to compensate for the nonlinear component of the error signal, and to optimize operation of the transmitter using the first and second coefficients.

16. The system according to claim 15, wherein the processor is configured to compute a Volterra series representation of the error signal, whereby the linear and nonlinear components of the error signal are represented respectively by linear and nonlinear parts of the Volterra series.

17. The system according to claim 15, wherein the one or more polynomial orders comprise a plurality of polynomial orders, and wherein the processor is configured to constrain the second memory depth to a given number over all of the polynomial orders, so that the nonlinear predistortion kernel comprises the same given number of the second coefficients for all of the polynomial orders.

18. The system according to claim 17, wherein the processor is configured to find an optimal number of the first coefficients in order to compensate for the linear component of the error signal, and wherein while constraining the given number of the second coefficients to be less than the optimal number of the first coefficients.

19. The system according to claim 17, wherein the processor is configured to find an optimal number of the second coefficients over all of the polynomial orders in order to compensate for the nonlinear component of the error signal.

20. The system according to claim 15, and comprising a digital predistortion block, which is configured to apply a digital predistortion, using the first and second coefficients, to a sequence of samples of the driving signal that are input to the transmitter.

21. The system according to claim 20, wherein the digital predistortion block comprises a look-up table (LUT) based on the second coefficients and a finite impulse response (FIR) filter comprising the first coefficients, which are applied to the sequence of the samples in order to generate predistorted samples for input to the transmitter.

22. The system according to claim 21, wherein the digital predistortion block is configured to look up the samples in the sequence in the LUT in order to generate linearized samples, and to multiply the linearized samples by the first coefficients in the FIR filter to generate respective tap products, and sum the tap products to generate the predistorted samples.

23. The system according to claim 20, wherein the processor is configured to identify optimal values of the first and second memory depths and to set respective numbers of the first and second coefficients to be used in the digital predistortion according to the optimal values of the first and second memory depths.

24. The system according to claim 15, wherein the processor is configured to estimate a dependence of the second coefficients on an operating parameter of the transmitter, and to adjust the operating parameter responsively to the estimated dependence.

25. The system according to claim 24, wherein the adjusted operating parameter comprises a bias voltage that is applied to the transmitter.

26. The system according to claim 24, wherein the adjusted operating parameter comprises a modulation range of the transmitter.

27. The system according to claim 15, wherein the processor is configured to analyze, using the first and second coefficients, a compatibility of the transmitter with a physical link over which the output signal is to be transmitted, whereby a property of the physical link is modified in order to rectify a detected incompatibility.

28. The system according to claim 15, wherein the transmitter comprises an optoelectronic component to which the driving signal is applied.

29. A computer software product, comprising a non-transitory computer-readable medium in which program instructions are stored, which instructions, when read by a processor, cause the processor to receive an error signal produced by comparing a driving signal applied to a transmitter to an output signal generated by the transmitter in response to the driving signal, to decompose the error signal into a linear component having a first memory depth and a nonlinear component having one or more polynomial orders and a second memory depth that is less than the first memory depth, to compute first coefficients, up to the first memory depth, of a linear predistortion kernel for application to the driving signal so as to compensate for the linear component of the error signal, to compute second coefficients for the one or more polynomial orders, up to the second memory depth, of a nonlinear predistortion kernel for application to the driving signal so as to compensate for the nonlinear component of the error signal, and to optimize operation of the transmitter using the first and second coefficients.

* * * * *